US010202706B2

(12) United States Patent
Nakabayashi et al.

(10) Patent No.: US 10,202,706 B2
(45) Date of Patent: Feb. 12, 2019

(54) SILICON CARBIDE SINGLE CRYSTAL WAFER AND METHOD OF MANUFACTURING A SILICON CARBIDE SINGLE CRYSTAL INGOT (71) Applicant: NIPPON STEEL & SUMIKIN MATERIALS CO., LTD., Tokyo (JP)

(72) Inventors: Masashi Nakabayashi, Yorii-Machi (JP); Kota Shimomura, Yorii-Machi (JP); Yukio Nagahata, Yorii-Machi (JP); Kiyoshi Kojima, Yorii-Machi (JP)

(73) Assignee: SHOWA DENKO K.K., Tokyo (JP)

( * ) Notice: Subject to any disclaimer, the term of this patent is extended or adjusted under 35 U.S.C. 154(b) by 442 days.

(21) Appl. No.: 14/761,485

(22) PCT Filed: Sep. 30, 2014

(86) PCT No.: PCT/JP2014/076014
§ 371 (c)(1),
(2) Date: Jul. 16, 2015

(87) PCT Pub. No.: WO2016/051485
PCT Pub. Date: Apr. 7, 2016

(65) Prior Publication Data
US 2016/0215414 A1 Jul. 28, 2016

(51) Int. Cl.
*C30B 23/00* (2006.01)
*C30B 23/06* (2006.01)
(Continued)

(52) U.S. Cl.
CPC .......... *C30B 23/063* (2013.01); *C30B 23/025* (2013.01); *C30B 23/06* (2013.01);
(Continued)

(58) Field of Classification Search
USPC ....................................................... 428/700
See application file for complete search history.

(56) References Cited

U.S. PATENT DOCUMENTS

2006/0075958 A1* 4/2006 Powell ................... C30B 23/00
117/89
2009/0205565 A1 8/2009 Nakabayashi et al.
(Continued)

FOREIGN PATENT DOCUMENTS

EP 1852527 A1 11/2007
JP 2001-294499 10/2001
(Continued)

OTHER PUBLICATIONS

Nakabayashi et al., Machine translation of JP 2011-219296 Description, Nov. 4, 2011 (Year: 2011).*
(Continued)

*Primary Examiner* — David Sample
*Assistant Examiner* — Mary I Omori
(74) *Attorney, Agent, or Firm* — Hunton Andrews Kurth LLP (57) ABSTRACT Provided is a SiC single crystal wafer, which is manufactured from a SiC single crystal ingot grown by the sublimation-recrystallization method, and which brings about high device performance and high device manufacture yield when used as a wafer for manufacturing a device. The SiC single crystal wafer has, in a surface thereof, a basal plane dislocation density of 1,000 dislocations per $cm^2$ or less, a threading screw dislocation density of 500 dislocations per $cm^2$ or less, and a Raman index of 0.2 or less. Further provided is a method of manufacturing a SiC single crystal ingot, including controlling heat input from a side surface of the single crystal ingot during growth of a single crystal, to thereby grow the crystal while changes in the temperature distribution of the single crystal ingot are reduced.

10 Claims, 6 Drawing Sheets (51) Int. Cl.
C30B 29/36 (2006.01)
C30B 23/02 (2006.01)
H01L 29/16 (2006.01)
H01L 29/32 (2006.01)

(52) U.S. Cl.
CPC .......... C30B 29/36 (2013.01); H01L 29/1608 (2013.01); H01L 29/32 (2013.01)

(56) References Cited

U.S. PATENT DOCUMENTS

| | | |
|---|---|---|
| 2012/0156122 A1 | 6/2012 | Nishiguchi |
| 2014/0220296 A1 | 8/2014 | Loboda et al. |
| 2014/0291700 A1 | 10/2014 | Gunjishima et al. |
| 2015/0128847 A1 | 5/2015 | Danno |

FOREIGN PATENT DOCUMENTS

| | | | |
|---|---|---|---|
| JP | 2002-284599 | | 10/2002 |
| JP | 2005-93519 | | 4/2005 |
| JP | 2006-290705 | | 10/2006 |
| JP | 2007-119273 | | 5/2007 |
| JP | 2011219296 A | * | 11/2011 |
| JP | 2012046424 A | | 3/2012 |
| JP | 2013-047159 | | 3/2013 |
| JP | 2013-139347 | | 7/2013 |
| JP | 2014-002104 | | 1/2014 |
| WO | WO 2010/041497 | | 4/2010 |
| WO | WO 2013/081164 | | 6/2013 |
| WO | WO 2013/157418 | | 10/2013 |

OTHER PUBLICATIONS

International Preliminary Report on Patentability for International Application No. PCT/JP2014/076014 dated Apr. 13, 2017.

Tairov et al., "General Principles of Growing Large-Size Single Crystals of Various Silicon Carbide Polytypes", Journal of Crystal Growth, vol. 52, 1981, pp. 146-150.

Burk et al., "SiC Epitaxial Layer Growth in a 6×150 mm Warm-Wall Planetary Reactor", Materials Science Forum, vols. 717-720, 2012, pp. 75-80.

Ohtani, Proceedings of $17^{th}$ Meeting on SiC and Related Wide Bandgap Semiconductors, 2008, p. 8 [with Concise Explanation in English].

Senzaki et al., "Effects of Dislocations on Reliability of Thermal Oxides Grown on n-type 4H—SiC Wafer", Materials Science Forum, 483-485, 2005, pp. 661-664.

Stahlbush et al., "Stacking-Fault Formation and Propagation in 4H—SiC PiN Diodes", Journal of Electronic Materials, vol. 31, 2002, pp. 370-375.

Bando et al., Proceedings of $19^{th}$ Meeting on SiC and Related Wide Bandgap Semiconductors, 2010, p. 140-141 [with Concise Explanation in English].

Yamamoto et al., Proceedings of $19^{th}$ Meeting on SiC and Related Wide Bandgap Semiconductors, 2010, pp. 11-12 [with Concise Explanation in English].

Ha et al., "Dislocation conversion in 4H silicon carbide epitaxy", Journal of Crystal Growth, vol. 244, 2002, pp. 257-266.

Kamei et al., "Solution growth of single crystalline 6H, 4H—SiC using Si—Ti—C melt," Journal of Crystal Growth, vol. 311, 2009, pp. 855-858.

Ohtani, "Propagation behavior of threading dislocations during physical vapor transport growth of silicon carbide (SiC) single crystals", Journal of Crystal Growth, vol. 286, 2006, pp. 55-60.

G. Ruland et al., Status of Large Diameter SiC Single Crystals, ECS Transactions, vol. 64, No. 7, Aug. 8, 2014, pp. 27-33.

J, Zhang et al., Defect Reduction Paths in SiC Epitaxy, MRS Proceedings, vol. 1693, Jun. 11, 2014.

Extended European Search Report dated Sep. 9, 2016, in corresponding EP Application No. 14877562.0.

* cited by examiner

SILICON CARBIDE SINGLE CRYSTAL WAFER AND METHOD OF MANUFACTURING A SILICON CARBIDE SINGLE CRYSTAL INGOT

CROSS-REFERENCE TO RELATED APPLICATIONS

This application is a national stage application of International Application No. PCT/JP2014/076014, filed Sep. 30, 2014, which is herein incorporated by reference in its entirety.

TECHNICAL FIELD

The present invention relates to a silicon carbide single crystal wafer that is low in basal plane dislocation density and threading screw dislocation density, furthermore small in Raman index, and accordingly has high crystal quality, and to a method of manufacturing a silicon carbide single crystal ingot from which the wafer can be obtained.

BACKGROUND ART

Silicon carbide (SiC) is a wide band-gap semiconductor having as wide a forbidden bandwidth as 2.2 to 3.3 eV, and is a subject of research and development as an environmentally-resistant semiconductor material because of its superior physical and chemical properties. SiC in recent years is particularly attracting attention as a material for short-wavelength (blue to ultraviolet) optical devices, high-frequency electronic devices, and high-withstand voltage, high-power electronic devices, and the research and development of SiC is active in that field. However, manufacturing a large-diameter single crystal of fine quality SiC is believed to be difficult, which has hindered the practical application of SiC devices.

A laboratory or a facility of a similar scale in the past has used, for example, the sublimation-recrystallization method (Lely method) to obtain a SiC single crystal of a size large enough to manufacture a semiconductor device. With this method, however, the resultant single crystal is small in area and it is difficult to control the dimensions and shape of the single crystal, as well as polytype and impurity carrier concentration. Another method that has been practiced uses chemical vapor deposition (CVD) to grow a cubic SiC single crystal through heteroepitaxial growth on a substrate made of a different material such as silicon (Si). The SiC single crystal grown by this method is large in area but contains many defects (up to $\times 10^7/cm^2$) due to an approximately 20% of SiC—Si lattice mismatch, and the method has not been successful in producing a high-quality SiC single crystal.

In order to solve these problems, the modified Lely method has been proposed, which uses a SiC single crystal wafer as a seed crystal for sublimation-recrystallization (see Non Patent Literature 1). The modified Lely method is capable of growing a SiC single crystal while controlling the polytype (6H, 4H, 15R, or the like), shape, carrier type, and carrier concentration. Of two hundred or more SiC polytypes, the 4H polytype is deemed the best in terms of crystal productivity and electronic device performance, and a SiC single crystal that is produced commercially is often 4H. Most of single crystal ingots are grown to have an n-type conductivity because nitrogen is a dopant that is easy to handle. In communication device uses, however, crystals of high resistivity, which hardly contain a dopant element, are manufactured as well.

Today, a SiC single crystal wafer having a diameter of 51 mm (2 inches) to 100 mm is cut out from a SiC single crystal manufactured by the modified Lely method, to be used for the manufacturing of devices in the power electronics field and similar fields. Successful development of a 150-mm wafer has also been reported (see Non Patent Literature 2), and the practical application of devices that use a 100- or 150-mm wafer is expected to start in full scale. Under such circumstances, wafer quality that is expressed by dislocation density or other indices and that has a significant impact on device performance and yield in mass production has come to be given a great importance in recent years.

In the modified Lely method, an unavoidable internal stress is generated in a growing single crystal ingot and remains in the ultimately obtained single crystal wafer in the form of elastic strain or dislocation (plastic strain). SiC wafers commercially available at present have $2 \times 10^3$ to $2 \times 10^4$ basal plane dislocations (hereinafter abbreviated as BPDs) per $cm^2$, $8 \times 10^2$ to $10^3$ threading screw dislocations (hereinafter abbreviated as TSDs) per $cm^2$, and $5 \times 10^3$ to $2 \times 10^4$ threading edge dislocations (hereinafter abbreviated as TEDs) per $cm^2$ (see Non Patent Literature 3).

A study conducted in recent years on crystal defects and devices has reported that BPD generates an oxide film defect in a device, thereby causing dielectric breakdown (see Non Patent Literature 4). In bipolar devices and the like, BPD has also been reported to cause stacking fault and is known to be the cause of deterioration in device characteristics (see Non Patent Literature 5). TSD causes leak current in a device (see Non Patent Literature 6), and is reported to shorten the lifetime of a gate oxide film (see Non Patent Literature 7). A SiC single crystal that has few BPDs and TSDs is therefore sought after in order to manufacture a high-performance SiC device.

There have been reported a plurality of technologies of reducing dislocation density. Examples of the reported technologies include transforming BPDs into TEDs by image force in the epitaxial growth of a SiC thin film with the use of chemical vapor deposition (CVD) (see Non Patent Literature 8), and substantially the same structural transformation in the solution growth method (see Non Patent Literature 9). A transformation of TEDs into BPDs reported by Ohtani et al. is given as an example of a reported technology that uses the sublimation-recrystallization method (see Non Patent Literature 10). However, there is no mention in these documents of the related art to a control method for reducing BPDs by structural transformation in the industrial manufacturing of a SiC single crystal, conditions thereof, and the like.

On the other hand, reported technologies that use the sublimation-recrystallization method include a method of obtaining a SiC single crystal that has few micropipes and few TSDs by growing a SiC single crystal as an initial growth layer at a given growth pressure and substrate temperature, and then growing a crystal by gradually decreasing the substrate temperature and the pressure (see Patent Literature 1). The TSD density of the SiC single crystal obtained by this method, however, is $10^3$ to $10^4$ dislocations per $cm^2$ (see the "Effects of the Invention" section in the specification of Patent Literature 1) and, considering the application to high-performance SiC devices, a further reduction of TSDs is needed.

Another method has been reported in which a SiC single crystal is grown as an initial growth layer at a given growth pressure and substrate temperature, and then a crystal is grown at an increased growth speed by maintaining the substrate temperature and reducing the pressure, to thereby reduce the generation of micropipes and lower the densities of TSD and other dislocations (see Patent Literature 2). The TSD reducing effect of this method is still insufficient.

Reported in Patent Literature 3 is a technology of obtaining a SiC single crystal wafer that is low in mosaicity by, in a sublimation-recrystallization method that uses a seed crystal, growing a SiC single crystal and cutting a seed crystal out of the SiC single crystal to conduct crystal growth again, and repeating this process a number of times so that the shape of the growing crystal is convex in the direction of growth. This technology utilizes the nature of a low-angle grain boundary, namely, an aggregation of dislocations, which is to propagate perpendicular to the growth surface, in order to form in the center of the growing crystal a region that is low in the density of low-angle grain boundaries, i.e., a region low in dislocation density, by shaping the growing crystal into a convex toward the growth direction and thus moving low-angle grain boundaries that are aggregations of dislocations to the perimeter of the growing crystal.

In the modified Lely method, in general, a crystal is grown by setting a temperature gradient in the direction of crystal growth so that the temperature is lower on the seed crystal side than on the side of SiC crystal particles that are the raw material of the growing crystal, and the shape on a growth plane of the growing single crystal can be determined by controlling the temperature distribution in the vicinity of the growth plane. In other words, because the growth plane is formed along an isothermal plane, in order to give the growing crystal a shape that is convex in the growth direction as in Patent Literature 3, for example, an isothermal line that is adequately convex toward the growth direction needs to be formed in a growth space so that a difference between a temperature $t_p$ at an arbitrary point on a growth surface in the perimeter of the growing crystal and an ingot center temperature $t_c$ equidistant from the crystal seed with respect to the arbitrary point ($\Delta t = t_p - t_c$) is positive. Growing a crystal while forming an isothermal line as this suppresses the generation of a polycrystal and is also known to be important in order to manufacture a quality SiC single crystal ingot of a single polytype by stably growing the objective polytype. However, when a single crystal ingot is manufactured by a growth process of the related art in which the temperature difference $\Delta t$ is large in a plane perpendicular to the growth direction, there is a risk in that great stress is created within the single crystal.

When the crystal orientation in a wafer plane is misaligned due to a large elastic strain on the wafer, on the other hand, a problem such as a trouble in the step flow of the epitaxial growth process arises and significantly affects device characteristics. A large elastic strain also exacerbates the warping of the wafer in some cases. Wafer warping gives rise to such problems as a focal point shift in the lithography process and the spillover of a raw material gas to the rear surface in the epitaxial growth process. A warped wafer presents obstacles in wafer handling such as transportation in the first place, and also requires consideration to the risk of a chuck causing damage.

As a growth technology that relaxes the internal stress of a single crystal ingot, a single crystal manufacturing apparatus is disclosed in Patent Literature 4. The single crystal manufacturing apparatus has a feature of including a temperature gradient control member, which is disposed in the periphery of a seed crystal or a single crystal grown on the seed crystal, and a local temperature gradient mitigating member, which is installed between the seed crystal or the single crystal and the temperature gradient control member. However, this technology is for preventing the generation and propagation of a crack in the growing crystal by reducing the local maximum value of a temperature gradient created in a single crystal that grows right above the seed crystal, and growth conditions of a site in the growing ingot that is turned into a wafer do not change essentially. The technology of this patent application therefore does not help in reducing the internal stress and dislocation density of a wafer.

The following methods have been reported as means for reducing wafer warping by the relaxing of elastic strain. Reported in Patent Literature 5 is a technology of preventing breaking or cracking in the machining of a SiC single crystal ingot or the device process of a SiC single crystal wafer by annealing the ingot or the wafer at a temperature that is above 2,000° C. and equal to or less than 2,800° C. in a non-corrosive gas atmosphere that contains carbon and hydrogen, or an atmosphere created by mixing these types of non-corrosive gas with argon or helium and thus relaxing the internal stress of the ingot or the wafer. Reported in Patent Literature 6 is a technology of giving a curvature radius of 35 m or more to a wafer that is cut out from a SiC single crystal ingot by performing heat treatment on the wafer at a temperature between 800° C. and 2,400° C. while pressurizing the wafer at 10 MPa or more and 0.5 MPa or less.

These methods may be effective in lessening elastic strain on a wafer, but reconfiguring atoms by externally applying a thermal load that exceeds 2,000° C. to a SiC single crystal involves a temperature raising process and a cooling process, thereby creating a new temperature distribution, and generates a high stress field inside the crystal from the temperature imbalance, with the possibility of generating a new dislocation. This phenomenon is manifested by an increase in the dislocation density of the annealed crystal in an embodiment of Patent Literature 6.

CITATION LIST

Patent Literature

[PTL 1] JP 2002-284599 A
[PTL 2] JP 2007-119273 A
[PTL 3] JP 2001-294499 A
[PTL 4] JP 2013-139347 A
[PTL 5] JP 2006-290705 A
[PTL 6] JP 2005-93519 A

Non Patent Literature

[NPL 1] Yu. M. Tairov and V. F. Tsvetkov, Journal of Crystal Growth, vols. 52 (1981) pp. 146-150
[NPL 2] A. A. Burk et al., Mater. Sci. Forum, 717-720, (2012) pp. 75-80
[NPL 3] Noboru Ohtani, Proceedings of 17th Meeting on SiC and Related Wide Bandgap Semiconductors, 2008, p. 8
[NPL 4] J. Senzaki et al., Mater. Sci. Forum, 483-485, (2005) pp. 661-664
[NPL 5] R. E. Stahlbush et al., Journal of Electronic Materials, 31, (2002), 370-375
[NPL 6] Banda et al., Proceedings of 19th Meeting on SiC and Related Wide Bandgap Semiconductors, 2010, p. 140-141
[NPL 7] Yamamoto et al., Proceedings of 19th Meeting on SiC and Related Wide Bandgap Semiconductors, 2010, p. 11-12
[NPL 8] S. Ha et al., Journal of Crystal Growth, 244, (2002), 257-266

[NPL 9] K. Kamei et al., Journal of Crystal Growth, 311, (2009), 855-858
[NPL 10] N. Ohtani et al., Journal of Crystal Growth, 286, (2006), 55-60

SUMMARY OF INVENTION

Technical Problem

While the manufacturing methods that reduce the dislocation density of a wafer and similar methods have been practiced as described above, recent findings indicate that improving the device yield and forming a favorable epitaxial thin film on a wafer are not possible with a wafer that is simply low in dislocation density.

The present invention has been made in view of the problems described above, and an object of the present invention is to provide a SiC single crystal wafer that is low in dislocation density and small in elastic strain as well, and a method of manufacturing a silicon carbide single crystal ingot from which the SiC single crystal wafer can be obtained.

Solution to Problem

As described above, while the reduction of BPD density and TSD density in a wafer is important to improve SiC device performance and the yield of a SiC device produced in mass, it is being found out that a wafer just low in dislocation density has problems such as the difficulty of forming a favorable epitaxial thin film on the wafer, and ultimately does not help in improving the yield and performance of a device. The inventors of the present invention have conducted multitudes of tests and examinations to solve the problems described above, and have arrived at a hypothesis in that a SiC single crystal wafer that is low in BPD density and TSD density and that is small in elastic strain inside the wafer as well improves the device performance and yield markedly.

With the manufacturing technologies of the related art that use the sublimation-recrystallization method, however, a large internal stress is inevitably generated during the growth of a single crystal, and remains in the form of dislocation (plastic strain) or elastic strain in the ultimately obtained crystal despite annealing or a similar step that is added after the growth. In short, a wafer that is low in dislocation density and elastic strain both cannot be mass-produced on an industrial scale by the related art. The inventors of the present invention have, as a result of extensive and thorough research, come up with an innovative single crystal manufacturing technology that accomplishes low dislocation density and low elastic strain both based on a novel finding relating to the internal stress. Thus, the present invention has been completed.

"Silicon carbide single crystal wafer" of the present invention means a circular plate that is obtained by the machining of a silicon carbide single crystal ingot, which involves cutting and subsequent mirror finishing.

The present invention includes the following configurations.

(1) A silicon carbide single crystal wafer, which has a diameter of 150 mm or more, the silicon carbide single crystal wafer having, in a surface thereof, a basal plane dislocation density of 1,000 dislocations per $cm^2$ or less, a threading screw dislocation density of 500 dislocations per $cm^2$ or less, and a Raman index of 0.2 or less.

(2) A silicon carbide single crystal wafer, which has a diameter of 100 mm or more, the silicon carbide single crystal wafer having, in a surface thereof, a basal plane dislocation density of 500 dislocations per $cm^2$ or less, a threading screw dislocation density of 300 dislocations per $cm^2$ or less, and a Raman index of 0.15 or less.

(3) A silicon carbide single crystal wafer according to Item (1), in which the Raman index is 0.15 or less.

(4) A silicon carbide single crystal wafer according to Item (1) or (2), in which the Raman index is 0.1 or less.

(5) A silicon carbide single crystal wafer according to Item (1), in which the basal plane dislocation density in the surface is 500 dislocations per $cm^2$ or less.

(6) A silicon carbide single crystal wafer according to any one of Items (1) to (4), in which the basal plane dislocation density in the surface is 300 dislocations per $cm^2$ or less.

(7) A silicon carbide single crystal wafer according to any one of Items (1) to (4), in which the basal plane dislocation density in the surface is 100 dislocations per $cm^2$ or less.

(8) A silicon carbide single crystal wafer according to any one of Items (1) to (7), in which the threading screw dislocation density is 300 dislocations per $cm^2$ or less.

(9) A silicon carbide single crystal wafer according to any one of Items (1) to (7), in which the threading screw dislocation density is 200 dislocations per $cm^2$ or less.

(10) A silicon carbide single crystal wafer according to any one of Items (1) to (7), in which the threading screw dislocation density is 100 dislocations per $cm^2$ or less.

(11) A silicon carbide single crystal wafer according to any one of items (1) to (10), in which a sum of the basal plane dislocation density and the threading screw dislocation density in the surface is 1,000 dislocations per $cm^2$ or less.

(12) A silicon carbide single crystal wafer according to any one of items (1) to (10), in which a sum of the basal plane dislocation density and the threading screw dislocation density in the surface is 500 dislocations per $cm^2$ or less.

(13) A silicon carbide single crystal wafer according to any one of Items (1) to (10), in which a sum of the basal plane dislocation density and the threading screw dislocation density in the surface is 300 dislocations per $cm^2$ or less.

(14) A method of manufacturing a silicon carbide single crystal ingot for manufacturing the silicon carbide single crystal wafer of anyone of claims 1 to 13, the method including: growing a silicon carbide single crystal through a sublimation-recrystallization method on a seed crystal that is housed in a crucible; and controlling heat input from a side surface of the silicon carbide single crystal ingot during growth of the silicon carbide single crystal ingot, to thereby grow the silicon carbide single crystal while changes in temperature distribution of the silicon carbide single crystal ingot are reduced.

(15) A method of manufacturing a silicon carbide single crystal ingot according to Item (14), further including using graphite felt subjected to high-temperature heat treatment at a temperature of 2,250° C. or higher as a heat insulating material to be disposed around the crucible that is used for crystal growth.

(16) A method of manufacturing a silicon carbide single crystal ingot according to Item (15), in which the temperature of the high-temperature heat treatment is 2,450° C. or higher.

(17) A method of manufacturing a silicon carbide single crystal ingot according to Item (14), further including mounting a thermal flux control member along a perimeter of a seed crystal attaching region of a crucible lid to which the seed crystal is attached, the thermal flux control member having room temperature heat conductivity $\Delta_2$ that satisfies a relation $1.1×λ_1≤λ_2$, where $λ_1$ represents room temperature heat conductivity of a member of the crucible lid that forms the seed crystal attaching region.

(18) A method of manufacturing a silicon carbide single crystal ingot according to item (17), in which the room temperature heat conductivity $λ_2$ of the thermal flux control member satisfies a relation $1.2×λ_1≤λ_2$.

(19) A method of manufacturing a silicon carbide single crystal ingot according to any one of Items (15) to (18), further including surrounding, when installed, the crucible for crystal growth by a peripheral space with an atmosphere gas containing 10 vol % of He gas or more.

(20) A method of manufacturing a silicon carbide single crystal ingot according to Item (19), in which the atmosphere gas in the peripheral space contains 20 vol % of He gas or more.

Advantageous Effects of Invention

The SiC single crystal wafer according to one embodiment of the present invention is low in dislocation density and small in elastic strain as well, and accordingly brings about high yield and favorable device characteristics in device manufacture in the power electronics field and other fields. For instance, the SiC single crystal wafer according to one embodiment of the present invention makes correct focusing in the lithography process and high-quality step flow growth in the epitaxial growth process possible. In addition, the low dislocation density reduces structural defects in a device and contributes to improvement in the performance and yield of the device. The present invention realizes a SiC single crystal wafer having this quality at as large a wafer diameter as 100 mm or more, and the practicality of the wafer is therefore supremely high.

DESCRIPTION OF EMBODIMENTS

The present invention is described in detail below.

First, a SiC single crystal wafer in the present invention has a diameter of 100 mm or more is low in BPD density and TSD density, and is small in elastic strain, which makes the manufacture of a high-performance device possible and, even in the industrial-scale manufacturing of a device, guarantees high yield. The BPD density of a SiC single crystal wafer of the present invention is 1,000 dislocations per $cm^2$ or less when the wafer diameter is 150 mm or more, and 500 dislocations per $cm^2$ or less when the wafer diameter is 100 mm or more. The TSD density of a SiC single crystal wafer in the present invention is 500 dislocations per $cm^2$ or less when the wafer diameter is 150 mm or more, and 300 dislocations per $cm^2$ or less when the wafer diameter is 100 mm or more.

There are several methods of evaluating elastic strain, including, for example, precise measurement of the lattice constant with the use of an X-ray. However, the measurement methods that have been used express elastic strain in vector, which leads to problems such as requiring a sophisticated analysis technology to evaluate the degree of impact on a device, and requiring time and skill for the measurement itself. This has prompted the inventors of the present invention to develop an optimum method of evaluating elastic strain that affects the yield of a device. It has been found as a result that, because of being (1) an evaluation index independent of wafer size, (2) capable of expressing elastic strain that is a vector in scalar that is simpler, and (3) short in measurement time, evaluating a differential between a value that is measured in the center of a wafer and a value that is measured in the perimeter of the wafer with respect to an inverse number of a wavelength at a Raman scattered light peak of SiC (namely, a Raman index) is most effective as the method of evaluating elastic strain. This method is therefore employed as an elastic strain evaluation method in the present invention.

A light source used in the present invention for Raman measurement is a green laser having a wavelength of 532 nm. The laser irradiated a spot 2 µm in diameter on a surface of a SiC single crystal wafer that was a sample. The measurement light irradiated eight rows by nine columns, seventy-two points in total, per measurement site at a spot interval of 10 µm, and an average value thereof was recorded as scattered light data in the measurement site. Each wafer has a measurement site the center of which is the center of the wafer, and a measurement site the center of which is a point located at 2 mm from the edge (circumference) of the wafer (a point that faces the wafer center at 2 mm from the wafer edge). The wavelength of Raman scattered light was measured at these two measurement sites. A differential between the wavenumbers (inverse numbers of the wavelengths) (value at the center—value at 2 mm from circumference) is used as a Raman index.

Figure 1:
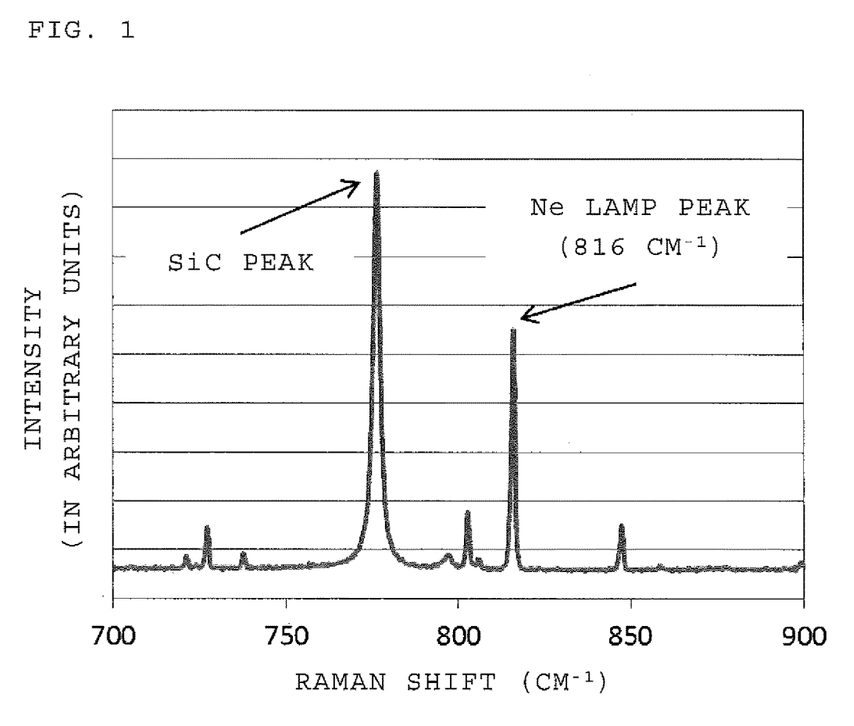
FIG. 1 is an example of the Raman scattering spectrum of a SiC wafer.

FIG. 1 shows an example of Raman scattered light measurement. A Raman shift peak of an Ne lamp at 816 $cm^{-1}$ was used for the calibration of the scattered light measurement. A positive larger value of the Raman index indicates a greater elastic strain on the wafer. Elastic strain on a wafer causes fluctuations in step direction and height on a surface of the wafer, which degrades the quality of an epitaxial thin film formed on the surface, and is therefore undesirable. The Raman index of a SiC single crystal wafer of the present invention is 0.2 or less, desirably 0.15 or less, more desirably 0.1 or less when the wafer diameter is 150 mm or more, and is 0.15 or less, desirably 0.1 or less when the wafer diameter is 100 mm or more. The Raman index normally takes a positive value, but can be a negative value in the case of a wafer manufactured under particular conditions. While it is unlikely for the Raman index to take a minus value that is large in absolute value under normal circumstances, a Raman index value smaller than −0.2 affects the manufacture of a device and therefore is undesirable.

A wafer that is lower in BPD density than the value given above brings about even higher device performance and yield. It is therefore desirable for a wafer 150 mm or more in diameter to have 500 BPDs per $cm^2$ or less, and, at any wafer diameter, the BPD density is desirably 300 dislocations per $cm^2$ or less, more desirably 100 dislocations per cm² or less. The same applies to TSD density: a wafer 150 mm or more in diameter desirably has the TSD density of 300 dislocations per cm² or less, and, at any wafer diameter, the TSD density is desirably 200 dislocations per cm² or less, more desirably 100 dislocations per cm² or less. When BPDs and TSDs are both reduced to a density lower than 100 dislocations per cm², the adverse effect on a device is estimated to be substantially zero.

As described above, different regulations are set for wafers having a diameter of 150 mm or more and wafers having a diameter of 100 mm or more. This is because wafers having a diameter of 150 mm or more are often used in the manufacture of a mass-produced, inexpensive device, whereas wafers having a diameter of 100 or more is used in the manufacture of a high-performance device and is accordingly required to have higher quality. BPD and TSD both hinder the practical application of a device as described above. A marked improvement in device performance and yield is therefore expected when the combined density of BPDs and TSDs is 1,000 dislocations per cm² or less. The sum of BPDs and TSDs are desirably 500 dislocations per cm² or less, more desirably 300 dislocations per cm² or less. Wafers having a diameter of 100 mm or more are defined as SiC single crystal wafers having a diameter of 100 mm or more and 300 mm or less in view of existing products and the like, and include, for example, what are called 100-mm wafers and 125-mm wafers. Similarly, wafers having a diameter of 150 mm or more are defined as SiC single crystal wafers having a diameter of 150 mm or more and 300 mm or less, and include what are called 150-mm wafers. A larger wafer diameter is preferred from the viewpoint of device productivity, and there is no upper limit to wafer diameter in that sense. With the current technology, however, the temperature difference within a crystal that is undergoing sublimation and recrystallization becomes excessively large when the wafer diameter exceeds 300 mm, and the difference in physical property throughout the wafer becomes prominent as well. In other words, a larger wafer diameter equals a higher internal stress, which is likely to make obtaining a high-quality wafer difficult, and a practical upper limit to wafer diameter is accordingly 300 mm.

In the manufacture of a SiC single crystal wafer as the one described above, a manufacturing method that has been the mainstream in the past is to grow a SiC single crystal ingot in an environment where as small a temperature gradient as possible is set so that stress on a growth surface is reduced. However, a temperature gradient set in a growth space is indispensable for the stable growth of a SiC single crystal ingot by the sublimation-recrystallization method as described above, and reducing the temperature gradient blindly has an adverse effect on the success rate and growth speed of single-polytype growth, which lowers productivity, and is disadvantageous industrially. From the industrial viewpoint, an ingot needs to be about 30 mm or more in height.

The inventors of the present invention have conducted research and development for years on a manufacturing method for obtaining a SiC single crystal wafer that is low in BPD and TSD, furthermore low in elastic strain in industrial-scale production. It has been found as a result that, surprisingly, the internal stress of a SiC single crystal ingot, which ultimately turns into dislocations and elastic strain in a wafer, is generated on a growth surface at the time of growth and also increases drastically by a change in the temperature distribution of the crystal after growth. This phenomenon is described in detail below.

In a SiC single crystal ingot at one point in time during growth, internal stress is generated by the temperature distribution at that point, and part of the internal stress is already transformed into dislocations. If the growth is completed while the temperature distribution at that point is maintained, a SiC single crystal wafer manufactured has a dislocation density and elastic strain that reflect this temperature distribution. Under actual manufacturing conditions, however, the temperature distribution changes for several reasons with the growth of the crystal, and new stress is consequently generated in the SiC single crystal ingot. The newly generated stress increases BPDs without fail. The atomic arrangement on the growth surface changes a well, thereby causing TSD. The elastic strain of the wafer also increases, and the manufacturing of a quality device is made difficult as a result. If the temperature distribution changes so as to reduce the temperature gradient, the change may reduce the elastic strain of an ultimately manufactured wafer. In that case still, however, dislocation is generated due to new stress applied by the application of a temperature field that is not balanced in terms of stress to the ingot that has been balanced in terms of stress under the original temperature distribution, and a wafer that is low in dislocation density and elastic strain both therefore cannot be manufactured.

The inventors of the present invention have accordingly thought of controlling heat input from a side surface of a single crystal ingot during the growth of the single crystal and thus reducing changes in the temperature distribution of the ingot during crystal growth, which may then keep BPDs and TSDs from increasing during growth and reduce elastic strain as well. However, actually measuring crystal temperature is impossible in an actual growth of a SiC single crystal. The inventors of the present invention have used the finite element method to analyze the temperature and internal stress in the single crystal ingot and a crucible, and have further performed multitudes of quality evaluations on actually grown crystals. The inventors of the present invention have found as a result a method of realizing the above idea, and successfully developed the SiC single crystal wafer of the present invention.

First, one of causes of a change in temperature distribution is a fluctuation in heat input from a side surface of a single crystal ingot due to deterioration in the characteristics of a heat insulating material that is disposed on the outside of a crucible in which the crystal is grown. A heat insulating material that is often used in the manufacture of a SiC single crystal by the sublimation-recrystallization method is graphite felt or a preformed heat insulating material made of graphite. Manufacturing conditions of these heat insulating materials include setting the treatment temperature to 1,000° C. or less in the case of the most common heat treatment, and setting the treatment temperature to 2,000° C. in the case of a high-temperature treatment product. The temperature in a crucible for a SiC single crystal is, at maximum, 2,400° C. or higher, which is over the treatment temperature of the heat insulating materials described above, and accordingly causes a reaction such as graphitization of the heat insulating material during crystal growth, thereby deteriorating the heat insulating characteristics. In addition, a sublimation gas component leaking from inside the crucible reacts with the heat insulating material in a thermochemical reaction, to thereby deteriorate the graphite material and degrade heat insulating properties. The deterioration of the heat insulating material is accompanied by a rise in an electric current that is input to a coil, owing to temperature feedback in apparatus control in the actual manufacture of a SiC single crystal ingot (because it is determined that the crucible temperature has dropped by the deterioration of the heat insulating characteristics). Then, while the temperature drops in a part of the crucible where the heat insulating material has deteriorated, the temperature may rise in a part of the crucible where the deterioration is light. The change in temperature gradient that is experienced by the single crystal ingot is therefore not uniform. In any case, a change in the temperature distribution of a single crystal ingot undoubtedly generates a new internal stress.

Performing heat treatment on the heat insulating material at a temperature of 2,250° C. or more, desirably 2,450° C. or more, prior to crystal growth prevents the exposure to high temperature during growth from changing the material characteristics and reduces the reactivity with the sublimation gas component as well. Although the mechanism of the reduction in reactivity with sublimation gas is unclear, it is deduced that the high degree of graphitization of graphite fiber and others are effective for the reduction. The heat treatment of the heat insulating material can be performed by a method in which one lot of raw heat insulating material is treated at once in an inert atmosphere, a method in which heat treatment uses an induction furnace for crystal growth with a heat insulating member that has been processed and assembled for growth attached to the crucible, or the like, and is not limited to a particular method. The treatment temperature has no particular upper limit but, considering that a ultra-high temperature environment causes graphite itself to sublime and is disadvantageous in terms of cost, a temperature around 3,000° C. is an appropriate upper limit.

Another major cause of a change in the temperature distribution of an ingot during crystal growth is a change in the amount of heat that passes through a graphite member forming the crucible from the raw material side where the temperature is high to the SiC single crystal side where the temperature is low, and subsequently enters a side surface of the ingot. Generally speaking, the crucible temperature is not constant and changes in the growth of a SiC single crystal. The change may be an active temperature adjustment for controlling the growth speed, or may be a passive fluctuation due to a change to the crucible interior state that accompanies growth. In any case, the temperature change is unavoidable. This temperature change is accompanied by a change in the amount of heat that enters the side surface of the ingot, with the result that the temperature distribution in the ingot changes. Even if the temperature is kept constant, the amount of heat that enters from the side surface of the single crystal ingot still changes because the side surface of the ingot increases in area as the SiC single crystal grows, and the temperature distribution in the ingot changes accordingly.

This temperature change can be reduced effectively by reducing a thermal flux from the crucible to the ingot and from the ingot to a seed crystal attaching region of a crucible lid to which a seed crystal is attached. The thermal flux is reduced by setting, along the perimeter of the seed crystal attaching region, a member higher in heat conductivity than a member that forms the seed crystal attaching region (hereinafter referred to as thermal flux control member), and increasing a thermal flux that flows from the crucible to the thermal flux control member. The effect is obtained by setting, as the heat conductivity of each member, the room temperature heat conductivity of the member that forms the seed crystal attaching region (which is denoted by $\lambda_1$) and the room temperature heat conductivity of the thermal flux control member (which is denoted by $\lambda_2$) so as to satisfy a relation $1.1 \times \lambda_1 \leq \lambda_2$. A more desirable condition is that the room temperature heat conductivity $\lambda_1$ and the room temperature heat conductivity $\lambda_2$ satisfy a relation $1.2 \times \lambda_1 \leq \lambda_2$. No particular upper limit is set to the value of $\lambda_2$. However, a value of the room temperature heat conductivity $\lambda_2$ that makes the ratio of $\lambda_2$ to $\lambda_1$ exceed 1.8 causes a great change in temperature distribution on the growth surface as well, which hinders stable growth, and therefore is undesirable. In order to control the heat input from the side surface of the ingot and reduce changes in the temperature distribution of the ingot during crystal growth, it is more effective to dispose the thermal flux control member outside the seed crystal attaching region to which the seed crystal is attached. However, the thermal flux control member may be disposed so as to partially overlap with the seed crystal attaching region around the perimeter of the seed crystal attaching region, as long as heat input to the side surface of the ingot can be controlled by increasing the thermal flux that flows from the crucible to the thermal flux control member.

Another method of reducing changes in ingot temperature is to increase the amount of heat that is diffused into the atmosphere from a crucible for crystal growth by improving the heat conductivity of an atmosphere gas in a peripheral space, which surrounds the crucible set in a double-walled quartz tube or the like. Hydrogen, which is generally known as a gas component that is high in heat conductivity, has adverse effects such as unintended etching of graphite and SiC, and is therefore undesirable. A gas type that is optimum in this case is helium, and the intended effect is obtained when the atmosphere contains 10 vol % of helium or more. A greater effect is obtained when the atmosphere contains 20 vol % of helium or more. The upper limit of helium is determined naturally in relation to cost and an electrical conductivity that is required of the wafer (i.e., the dopant concentration in the atmosphere). However, helium gas contained in a concentration of 50 vol % or more causes a great change in temperature distribution on the growth surface as well, which hinders stable growth, and therefore is undesirable.

EXAMPLES

A concrete description of the present invention is given below based on Examples and Comparative Examples.

Figure 4:
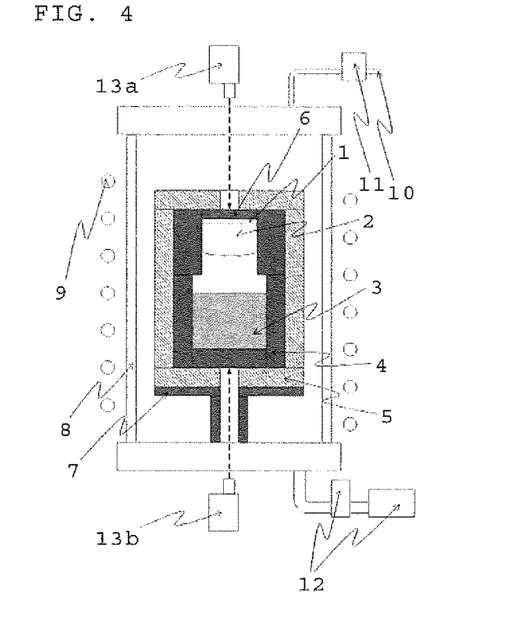
FIG. 4 is a schematic diagram illustrating a crystal growing apparatus that is used in the present invention.

FIG. 4 illustrates an apparatus for growing a single crystal by the modified Lely method, which is used in the manufacture of a SiC single crystal ingot for manufacturing SiC single crystal wafers according to Example of the present invention and Comparative Examples. A crystal is grown by sublimating a sublimation raw material 3 through induction heating and recrystallizing the sublimated material on a seed crystal 1. The seed crystal 1 is attached to an inner surface of a graphite lid (crucible lid) 6, and the sublimation raw material 3 fills the interior of a graphite crucible 4. The graphite crucible 4 and the graphite lid 6 are covered with a heat insulating material 5 for heat shielding, and installed on a graphite support seat 7 inside a double-walled quartz tube 8. The interior of the quartz tube 8 is evacuated to less than $1.0 \times 10^{-4}$ Pa with the use of a vacuum pump apparatus and pressure control apparatus 12. Thereafter, a highly pure Ar gas having a purity of 99.9999% or higher is caused to flow into the quartz tube 8 via a pipe 10 under control of a mass flow controller 11. A high-frequency current is caused to flow in a work coil 9 while the pressure in the quartz tube is kept at 80 kPa with the use of the vacuum pump apparatus and pressure control apparatus 12 to raise the temperature in a lower part of the graphite crucible to a target temperature, which is 2,400° C. Nitrogen gas ($N_2$) is similarly caused to flow into the quartz tube 8 via the pipe 10 under control of the mass flow controller 11, and the concentration of the nitrogen element taken into the SiC crystal is adjusted by controlling the partial pressure of nitrogen in the atmosphere gas. The crucible temperature is measured by providing light paths that have a diameter of 2 to 15 mm in portions of the heat insulating material 5 that are positioned in an upper part and a lower part of the crucible, and using radiation thermometers 13a and 13b. The temperature in the upper part of the crucible is deemed as a seed crystal temperature and the temperature in the lower part of the crucible is deemed as a raw material temperature. The pressure in the quartz tube is then reduced to a growth pressure, which is 0.8 kPa to 3.9 kPa, over a period of approximately fifteen minutes, and this state is maintained for a given period of time to grow a crystal.

Example 1

First, a crucible in which no raw material and no seed crystal were loaded and a set of pieces of commercially available graphite felt that had been treated by heat treatment at 2,000° C. were prepared. Another round of heat treatment was performed on the graphite felt prior to crystal growth. Thereafter, the crucible and the heat insulating material were assembled the same way as in crystal growth and installed in the Quartz tube in the manner described above as preparation for crystal growth, and the quartz tube was evacuated. The highly pure Ar gas was subsequently caused to flow into the Quartz tube via the pipe under control of the mass flow controller, a high-frequency current was caused to flow in the work coil while maintaining the pressure in the quartz tube at 80 kPa, the temperatures in the lower part of the graphite crucible and the upper part of the graphite crucible were raised to their respective target temperatures, and this state was maintained for twelve hours. Thus, heat treatment was completed. The heat treatment of the graphite felt in Example 1 was conducted at a temperature of 2,300° C. in a highly pure argon atmosphere for twelve hours.

The crystal growth of Example 1, which has been performed with the use of the above crucible and felt, is described next. Used as the seed crystal 1 is a SiC single crystal wafer having a diameter of 101 mm and made of a single polytype, specifically, 4H. The principal surface of the wafer is a (0001) plane and the <0001> axis of the wafer is tilted by 4° in the <11-20> direction. The growth pressure is 1.33 kPa, and the partial pressure of nitrogen gas is 180 Pa to 90 Pa. The partial pressure of nitrogen was varied in order to maintain an optimum conductivity of the overall ingot. Compared to common graphite felt, felt that is subjected to high-temperature heat treatment as the one in this Example deteriorates less and reduces fluctuations in heat input from a side surface of the single crystal ingot, thereby making the manufacture of a SiC single crystal wafer that is low in dislocation density and elastic strain possible.

The thus obtained SiC single crystal ingot was 106.8 mm in diameter and 34.8 mm in height. A SiC single crystal ingot for manufacturing a 100 mm-diameter wafer according to Example 1 was manufactured in this manner.

The obtained ingot was machined by a known machining technology into eight mirror-finished wafers having a (0001) plane with the off angle set to 4° similarly to the seed crystal and having a thickness of 0.4 mm, and the wafers were evaluated for quality. The wafers are assigned wafer numbers 11 to 18 starting from the seed crystal side. The relative positions of the wafers No. 11 to No. 18 relative to the ingot height take values between 0.2 to 0.9 at intervals of 0.1. In other words, a relative position 0 corresponds to the seed crystal surface and a relative position 1.0 corresponds to the ingot height.

Figure 2:
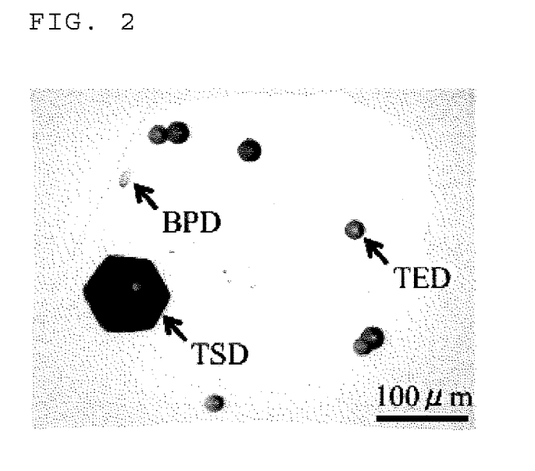
FIG. 2 is an example of an observed etch pit image.
Figure 3:
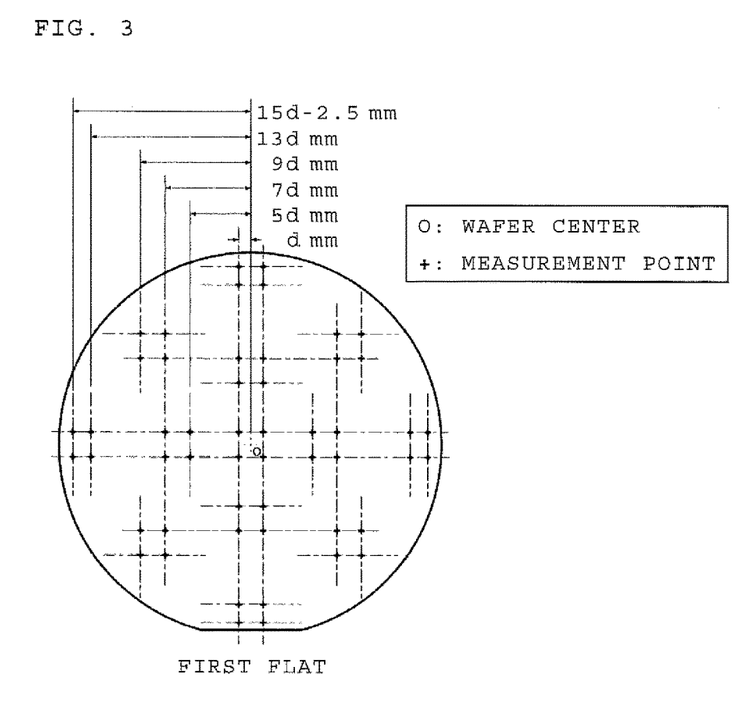
FIG. 3 is a diagram illustrating etch pit measuring points in a wafer.

Raman shifts of the eight manufactured wafers were measured first by the method described above with the use of a Raman spectrometer (NRS-7100, a product of JASCO Corporation having a resolution of ±0.05 cm$^{-1}$). Thereafter, molten KOH etching was performed to measure BPD density and TSD density with an optical microscope. Here, a method described in Takahashi, J., et al., "Journal of Crystal Growth", 135, (1994), pp. 61-70 was followed to immerse a sample in molten KOH at 530° C. for 10 minutes, and dislocation defects were sorted by etch pit shape, with a shell-shaped pit classified as a BPD and a hexagonal pit of a middle to large size classified as a TSD. An example of etch pit observation is shown in FIG. 2. The dislocation density is calculated by a method illustrated in FIG. 3, where fifty-two points are symmetrical from left to right and from top to bottom in the drawing. A measurement area was set so as to place the points at the center of the measurement area. The measurement area is 2,073 μm×1,601 μm for TSD of which the pit size is large, and the measurement area for other defects than TSD is 663 μm×525 μm. Etch pits within the measurement area were counted and an average value thereof was set as the dislocation density of the wafer. The value of d in FIG. 3 is 3.25 mm for a 100-mm wafer and 4.8 mm for a 150-mm wafer. A wafer whose diameter is other than 100 mm and 150 mm can accurately be evaluated for dislocation density irrespective of wafer diameter by selecting an appropriate value for d.

Results of the evaluation are shown in Table 1. In the wafer No. 18, the BPD density is 500 dislocations per cm$^2$ or less, and the combined density of BPDs and TSDs is less than 1,000 dislocations per cm$^2$ as well. The characteristics of this wafer are thus within the scope of the present invention.

TABLE 1

| Wafer number | Raman index | BPD density dislocations/cm$^2$ | TSD density dislocations/cm$^2$ | Sum of BPD density and TSD density |
|---|---|---|---|---|
| 11 | 0.20 | 2,450 | 360 | 2,810 |
| 12 | 0.18 | 1,250 | 330 | 1,580 |
| 13 | 0.17 | 980 | 290 | 1,270 |
| 14 | 0.15 | 890 | 280 | 1,170 |
| 15 | 0.13 | 870 | 270 | 1,140 |
| 16 | 0.11 | 800 | 260 | 1,060 |
| 17 | 0.09 | 710 | 260 | 970 |
| 18 | 0.07 | 490 | 250 | 740 |

Example 2

Example 2 is described next. In Example 2, a set of pieces of commercially available graphite felt that had been treated by heat treatment at 2,000° C. was prepared as in Example 1, and another round of heat treatment was performed on the graphite felt prior to crystal growth. The heat treatment of the graphite felt in Example 2 is the same as the one in Example 1, except that the heat treatment temperature is set to 2,500° C.

A crystal growing method of Example 2 which uses the crucible and felt described above is the same as the method in Example 1. Example 2, where the manufacturing of a SiC single crystal wafer that is low in dislocation density and low in elastic strain is made possible from the same reasons that are given in Example 1, is particularly effective for the reduction of BPDs because the use of the graphite felt treated at a higher temperature prevents heat insulating material deterioration from reducing the in-plane temperature gradient excessively.

A SiC single crystal ingot for manufacturing a 100 mm-diameter wafer was manufactured in this manner to have a diameter of 105.7 mm and a height of 37.9 mm.

The obtained ingot was machined into eight mirror-finished wafers having the same relative positions in the ingot as in Example 1 (the wafers were assigned wafer numbers 21 to 28 starting from the seed crystal side). The wafers were evaluated for quality. Results of the evaluation are shown in Table 2. The wafers No. 27 and No. 28 have a quality that is within the scope of the present invention in terms of BPD density and the combined density of BPDs and TSDs as well.

TABLE 2

| Wafer number | Raman index | BPD density dislocations/cm² | TSD density dislocations/cm² | Sum of BPD density and TSD density |
|---|---|---|---|---|
| 21 | 0.22 | 2,540 | 360 | 2,900 |
| 22 | 0.21 | 1,280 | 300 | 1,580 |
| 23 | 0.19 | 980 | 280 | 1,260 |
| 24 | 0.17 | 840 | 260 | 1,100 |
| 25 | 0.15 | 740 | 240 | 980 |
| 26 | 0.12 | 660 | 240 | 900 |
| 27 | 0.10 | 480 | 240 | 720 |
| 28 | 0.08 | 470 | 240 | 710 |

Example 3

Figure 5:
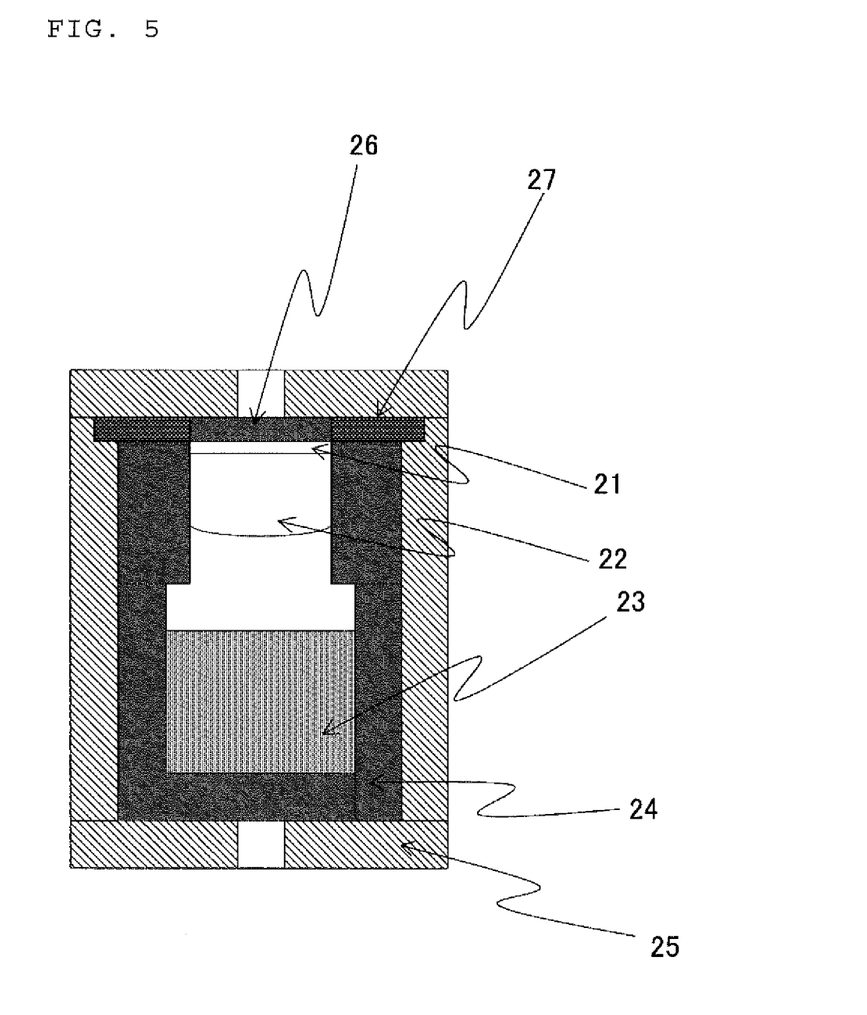
FIG. 5 is a schematic diagram illustrating a crucible structure that is used in Example of the present invention.

A crystal manufacturing method of Example 3 is described next. In Example 3, a graphite crucible 24 that is structured as illustrated in a schematic diagram of FIG. 5 is used for crystal growth. In this graphite crucible 24, a seed crystal 21 is attached to an inner surface of a crucible lid 26. A thermal flux control member 27 made of graphite that has high heat conductivity is disposed so as to be in contact with a circumferential surface of the crucible lid 26 and surround the crucible lid 26. The crucible lid 26 forms a seed crystal attaching region to which the seed crystal 21 is attached. The room temperature heat conductivity of the crucible lid 26, which is denoted by $\lambda_1$, and the room temperature heat conductivity of the thermal flux control member 27, which is denoted by $\lambda_2$, satisfy a relation $1.15 \times \lambda_1 \leq \lambda_2$. In Example 3, heat treatment was performed on graphite felt at 2,300° C. prior to crystal growth as in Example 1. A single crystal ingot was manufactured under the same crystal growth conditions as those in Example 1, except that the crucible structure included the thermal flux control member 27. The crucible structure of Example 3 is a structure intended to prevent an excessive thermal flux from entering the single crystal ingot under a condition where a thermal flux flowing along a side surface of the single crystal ingot has increased. This crucible structure reduces fluctuations in heat input from the side surface of the single crystal ingot, thereby making the manufacture of a SiC single crystal wafer that is low in dislocation density and low in elastic strain possible.

In Example 3, a crucible that includes the thermal flux control member 27 described above is used and the heat insulating material is treated by the same heat treatment method as the one in Example 1. The thus obtained SiC single crystal ingot was 105.5 mm in diameter and 37.8 mm in height.

The obtained ingot was machined into eight mirror-finished wafers having the same relative positions in the ingot as in Example 1 (the wafers were assigned wafer numbers 31 to 38 starting from the seed crystal side). The wafers were evaluated for quality. Results of the evaluation are shown in Table 3. The wafers No. 33 to No. 38 have characteristics that are within the scope of the present invention. The wafers No. 34 to No. 38, in particular, have a combined density of BPDs and TSDs that is lower than 500 dislocations per cm², and are very favorable.

TABLE 3

| Wafer number | Raman index | BPD density dislocations/cm² | TSD density dislocations/cm² | Sum of BPD density and TSD density |
|---|---|---|---|---|
| 31 | 0.18 | 2,600 | 280 | 2,880 |
| 32 | 0.15 | 990 | 190 | 1,180 |
| 33 | 0.12 | 360 | 160 | 520 |
| 34 | 0.09 | 300 | 160 | 460 |
| 35 | 0.06 | 280 | 160 | 440 |
| 36 | 0.04 | 280 | 150 | 430 |
| 37 | 0.03 | 270 | 140 | 410 |
| 38 | 0.02 | 270 | 130 | 400 |

Example 4

Figure 6:
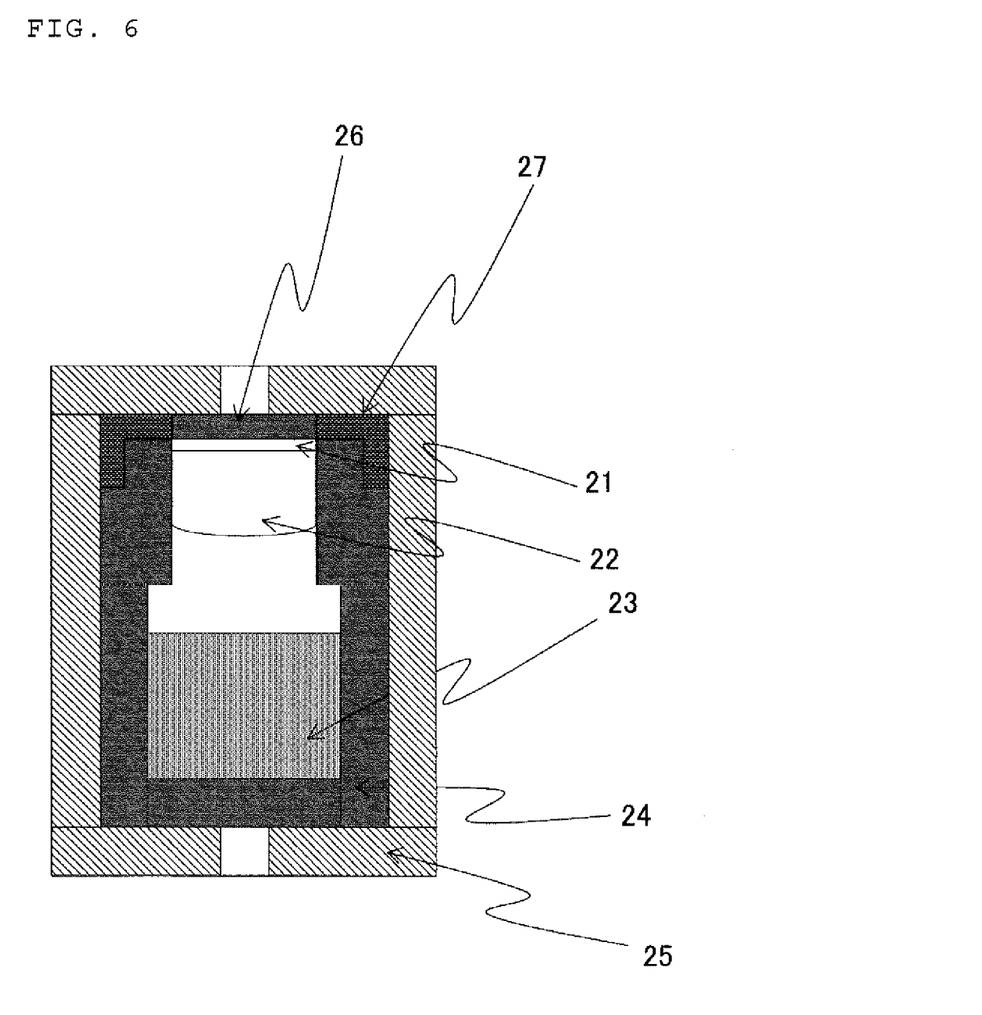
FIG. 6 is a schematic diagram illustrating a crucible structure that is used in Example of the present invention.

A crystal manufacturing method of Example 4 is described next. In Example 4, a graphite crucible 24 that is structured as illustrated in a schematic diagram of FIG. 6 is used for crystal growth. In this graphite crucible 24, a seed crystal 21 is attached to an inner surface of a crucible lid 26. A thermal flux control member 27 made of graphite that has high heat conductivity is disposed so as to be in contact with a circumferential surface of the crucible lid 26 and surround the crucible lid 26. Further, a part of the thermal flux control member 27 is extended to the outer part of the side wall of the graphite crucible. The crucible lid 26 forms a seed crystal attaching region to which the seed crystal 21 is attached. The room temperature heat conductivity of the crucible lid 26, which is denoted by $\lambda_1$, and the room temperature heat conductivity of the thermal flux control member 27, which is denoted by $\lambda_2$, satisfy a relation $1.3 \times \lambda_1 \leq \lambda_2$. In Example 4, heat treatment was performed on graphite felt prior to crystal growth. The heat treatment of the graphite felt in Example 4 was performed at 2,500° C., which is the same condition as in Example 2. A single crystal ingot was manufactured under the same crystal growth conditions as those in Example 1, except that the crucible structure included the thermal flux control member 27.

In Example 4, a crucible designed for the same purpose as the one described in Example 3 was used and the heat insulating material was treated by the same heat treatment method as the method of Example 2. These reduce fluctuations in heat input from the side surface of the single crystal ingot more effectively, and make it possible to manufacture a SiC single crystal wafer that is even lower in dislocation density and elastic strain than in Examples described above. The thus obtained SiC single crystal ingot was 105.7 mm in diameter and 39.6 mm in height.

The obtained ingot was machined into eight mirror-finished wafers having the same relative positions in the ingot as in Example 1 (the wafers were assigned wafer numbers 41 to 48 starting from the seed crystal side). The wafers were evaluated for quality. Results of the evaluation are shown in Table 4. The wafers all have characteristics that are within the scope of the present invention. The wafers No. 44 to No. 48, in particular, have a combined density of BPDs and TSDs that is lower than 300 dislocations per cm$^2$, and are extremely favorable.

TABLE 4

| Wafer number | Raman index | BPD density dislocations/cm$^2$ | TSD density dislocations/cm$^2$ | Sum of BPD density and TSD density |
|---|---|---|---|---|
| 41 | 0.14 | 450 | 280 | 730 |
| 42 | 0.12 | 330 | 160 | 490 |
| 43 | 0.09 | 250 | 140 | 390 |
| 44 | 0.07 | 110 | 140 | 250 |
| 45 | 0.05 | 90 | 140 | 230 |
| 46 | 0.03 | 80 | 130 | 210 |
| 47 | 0.01 | 80 | 120 | 200 |
| 48 | 0.00 | 80 | 110 | 190 |

Example 5

Figure 7:
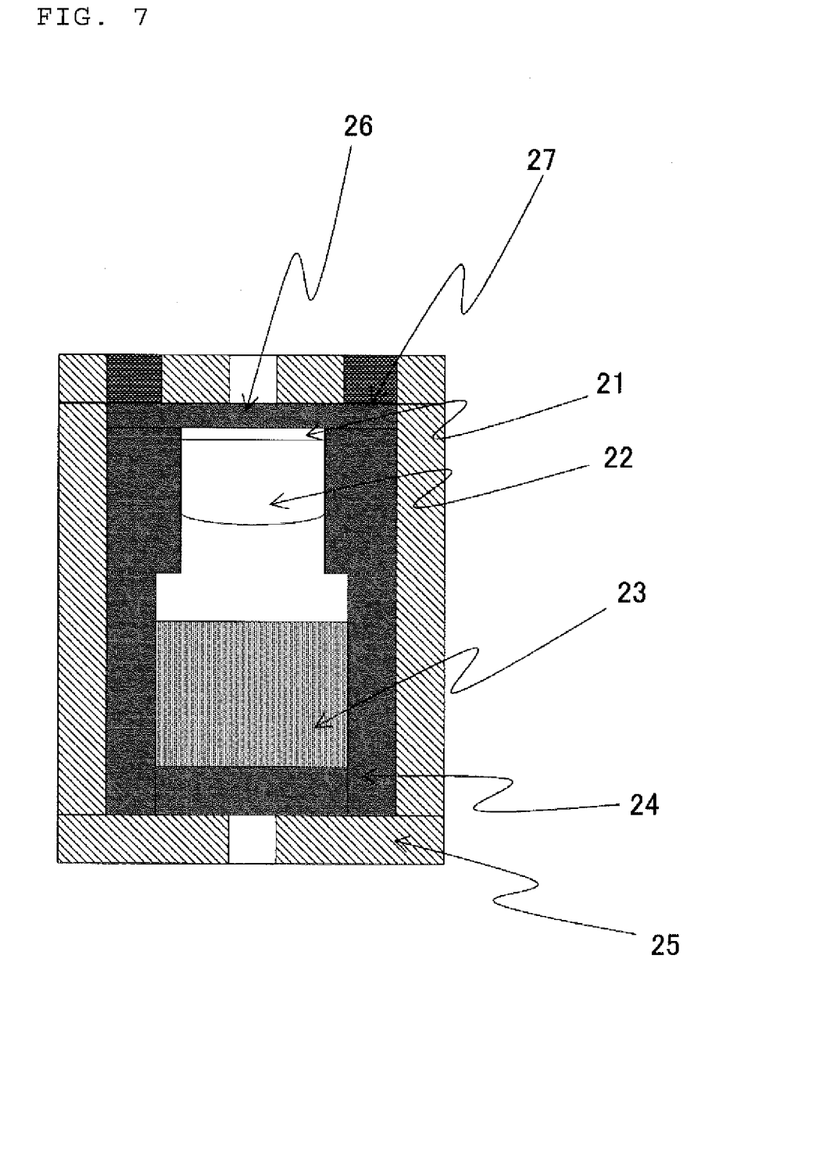
FIG. 7 is a schematic diagram illustrating a crucible structure that is used in Example of the present invention.

Example 5 is described next. A wafer having a diameter of 150 mm was manufactured in Example 5. Crystal manufacturing in Example 5 uses a crucible and a heat insulating material that are sized to an ingot for a 150 mm-diameter wafer. The basic structure of the crucible and the heat insulating material, however, is as illustrated in FIG. 7. In this graphite crucible 24, a seed crystal 21 is attached to a substantially center part of an inner surface of a crucible lid 26. A thermal flux control member 27 made of graphite that has high heat conductivity is disposed on the outer side of the crucible lid 26 so as to surround a seed crystal attaching region to which the seed crystal 21 is attached. The crucible lid 26 includes a member that forms at least the seed crystal attaching region to which the seed crystal 21 is attached. The room temperature heat conductivity of the member, which is denoted by $\lambda_1$, and the room temperature heat conductivity of the thermal flux control member 27, which is denoted by $\lambda_2$, satisfy a relation $1.3\times\lambda_1 \leq \lambda_2$ as in Example 4. In Example 5, heat treatment was performed on graphite felt prior to crystal growth. The heat treatment of the graphite felt in Example 5 was performed at 2,500° C., which is the same condition as in Example 2.

The seed crystal used in Example 5 is a SiC single crystal wafer having a diameter of 154 mm and made of a single polytype, specifically, 4H. The principal surface of the wafer is a (0001) plane and the <0001> axis of the wafer is tilted by 4° in the <11-20> direction. A single crystal ingot was manufactured under substantially the same crystal growth conditions as those in Example 1, except the size of the seed crystal and the crucible structure, which included the thermal flux control member 27.

While Example 5 is an example of manufacturing a single crystal ingot that is for manufacturing a 150 mm-diameter wafer, the idea on how to manufacture the ingot in Example 5 is basically the same as in Example 4, and a SiC single crystal wafer that is low in dislocation density and low in elastic strain can be manufactured also from an ingot having a different diameter. A SiC single crystal ingot of Example 5 for manufacturing a 150 mm-diameter wafer was manufactured in this manner. The thus obtained SiC single crystal ingot was 158.1 mm in diameter and 42.6 mm in height.

The obtained ingot was machined into eight mirror-finished wafers having the same relative positions in the ingot as in Example 1 (the wafers were assigned wafer numbers 51 to 58 starting from the seed crystal side). The wafers were evaluated for quality. Results of the evaluation are shown in Table 5. The wafers all have characteristics that are within the scope of the present invention. The wafers No. 55 to No. 58, in particular, have a combined density of BPDs and TSDs that is lower than 300 dislocations per cm$^2$, and are extremely favorable.

Homogeneous epitaxial growth was performed on a Si plane of the wafer No. 58. Conditions for the epitaxial growth include setting the growth temperature to 1,550° C., setting the silane ($SiH_4$) flow rate, the propane ($C_3H_8$) flow rate, and the hydrogen ($H_2$) flow rate to 32 cc/min, 21 cc/min, and 150 L/min, respectively, and setting the flow rate of nitrogen gas to a rate that makes the carrier concentration in an active layer $1\times10^{16}$ cm$^{-3}$. The active layer was grown to a thickness of approximately 5 μm. The resultant epitaxial film was found to have a surface extraordinarily flat throughout and have very few epitaxial defects such as carrot defects. In short, a favorable epitaxial thin film was formed. A MOSFET structure was built on this epitaxial wafer, and the withstand voltage of its gate insulating film was measured to be approximately 820 V.

TABLE 5

| Wafer number | Raman index | BPD density dislocations/cm$^2$ | TSD density dislocations/cm$^2$ | Sum of BPD density and TSD density |
|---|---|---|---|---|
| 51 | 0.13 | 460 | 360 | 820 |
| 52 | 0.11 | 330 | 230 | 560 |
| 53 | 0.09 | 240 | 210 | 450 |
| 54 | 0.07 | 130 | 190 | 320 |
| 55 | 0.06 | 120 | 180 | 300 |
| 56 | 0.05 | 110 | 170 | 280 |
| 57 | 0.04 | 110 | 160 | 270 |
| 58 | 0.03 | 100 | 160 | 260 |

Example 6

Figure 8:
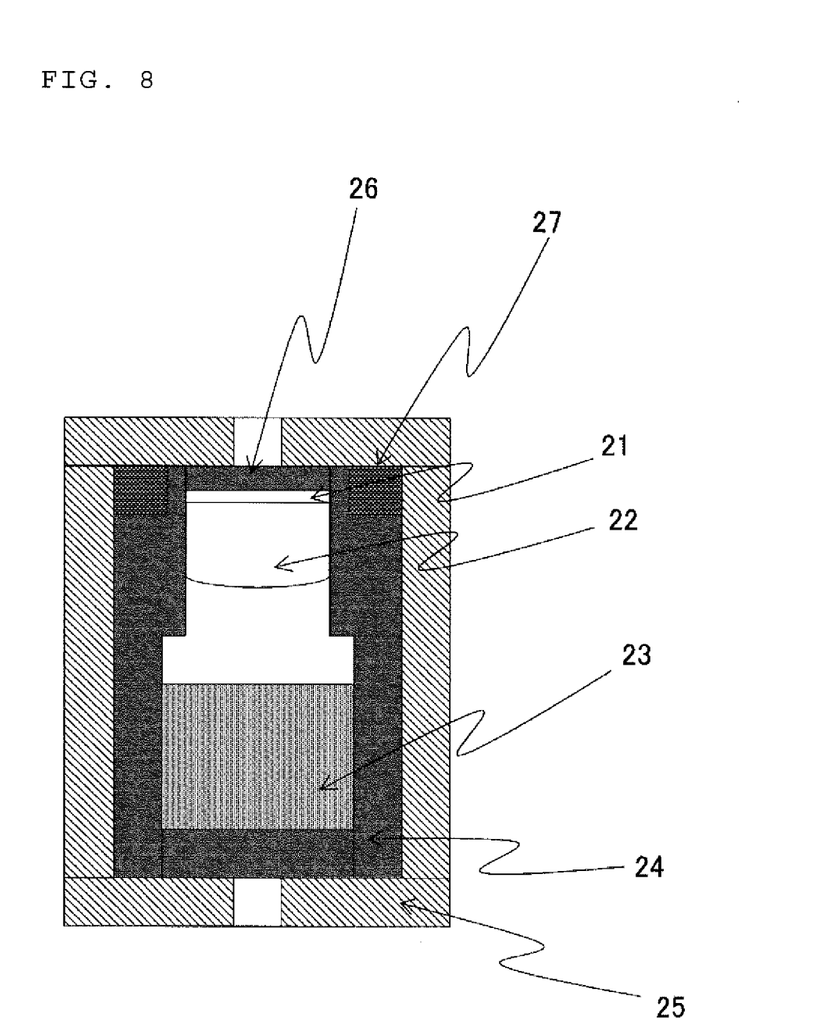
FIG. 8 is a schematic diagram illustrating a crucible structure that is used in Example of the present invention.

A crystal manufacturing method of Example 6 is described next. In Example 6, a graphite crucible 24 that is structured as illustrated in a schematic diagram of FIG. 8 is used for crystal growth. In this graphite crucible 24, a seed crystal 21 is attached to an inner surface of a crucible lid 26. A thermal flux control member 27 made of graphite that has high heat conductivity is disposed on a circumferential surface of the crucible lid 26 via a part of a side wall of the graphite crucible. The crucible lid 26 forms a seed crystal attaching region to which the seed crystal 21 is attached. The room temperature heat conductivity of the crucible lid 26, which is denoted by $\lambda_1$, and the room temperature heat conductivity of the thermal flux control member 27, which is denoted by $\lambda_2$, satisfy a relation $1.4\times\lambda_1 \leq \lambda_2$. In Example 6, heat treatment was performed on graphite felt prior to crystal growth. The heat treatment of the graphite felt in Example 4 was performed at 2,500° C., which is the same condition as in Example 2.

Crystal growth conditions in Example 6 are the same as those in Example 1, except that, in Example 6, He gas is mixed in an atmosphere gas in the peripheral space surrounding the graphite crucible, which is installed in the double-walled quartz tube 8. The He gas content ratio is 16 vol %. The crucible used in Example 6 is designed for the same purpose as the one described in Example 4. The graphite felt used in Example 6 is treated by the same heat treatment conditions as those in Example 4. Example 6 also aims for a further reduction in temperature gradient by giving the atmosphere gas high heat conductivity. The thus obtained SiC single crystal ingot was 108.7 mm in diameter and 56.3 mm in height.

The obtained ingot was machined into eight mirror-finished wafers having the same relative positions in the ingot as in Example 1 (the wafers were assigned wafer numbers 61 to 68 starting from the seed crystal side). The wafers were evaluated for quality. Results of the evaluation are shown in Table 6. The wafers No. 63 to No. 68 have characteristics that are within the scope of the present invention in both a BPD density and a combined density of BPDs and TSDs. The wafers No. 66 to No. 68, in particular, have a combined density of BPDs and TSDs that is lower than 500 dislocations per cm$^2$, and are extremely favorable. Although the dislocation density was slightly higher compared to Example 4, a wafer very small in elastic strain was successfully manufactured as indicated by the Raman index. It is likely that a SiC single crystal wafer that is even lower in dislocation density and elastic strain can be manufactured by optimizing the crucible structure, the gas composition, and crystal growth conditions in a comprehensive manner.

TABLE 6

| Wafer number | Raman index | BPD density dislocations/cm$^2$ | TSD density dislocations/cm$^2$ | Sum of BPD density and TSD density |
|---|---|---|---|---|
| 61 | 0.15 | 1,260 | 270 | 1,530 |
| 62 | 0.13 | 680 | 190 | 1,170 |
| 63 | 0.09 | 490 | 150 | 640 |
| 64 | 0.06 | 430 | 150 | 580 |
| 65 | 0.03 | 400 | 130 | 530 |
| 66 | 0.01 | 340 | 120 | 460 |
| 67 | 0.00 | 300 | 120 | 420 |
| 68 | −0.02 | 280 | 110 | 390 |

Comparative Example 1

Comparative Example 1 is described next. In Comparative Example 1, a crystal was grown by using a set of pieces of commercially available graphite felt that had been treated by heat treatment at 2,000° C. The crucible structure is the same as the one in Example 1. The crystal growth method in Comparative Example is substantially the same as the method in Example 1. In Comparative Example 1, common graphite felt and a common graphite crucible are used, and fluctuations in heat input from the side surface of the single crystal ingot are therefore not reduced, which means that a SiC single crystal wafer that is low in dislocation density and elastic strain cannot be manufactured. The thus obtained SiC single crystal ingot was 107.4 mm in diameter and 35.2 mm in height.

The obtained ingot was machined into eight mirror-finished wafers having the same relative positions in the ingot as in Example 1 (the wafers were assigned wafer numbers 71 to 78 starting from the seed crystal side). The wafers were evaluated for quality. Results of the evaluation are shown in Table 7. The properties of the wafers are examined for each evaluation item. The Raman index of every wafer except the wafer No. 71 takes a value that is within the scope of the present invention. The dislocation density, on the other hand, is high in every wafer, and the BPD density is particularly high. Consequently, none of the obtained wafers have characteristics that are within the scope of the present invention.

Homogeneous epitaxial growth was performed on a Si plane of the wafer No. 78 under the same conditions as those in Example 6 to grow an active layer having a thickness of approximately 5 μm. In a surface of the resultant epitaxial film, disorder in surface morphology such as bunching was observed and many epitaxial defects such as carrot defects were found. A MOSFET structure was built on this epitaxial wafer, and the withstand voltage of its gate insulating film was measured to be approximately 270 V.

TABLE 7

| Wafer number | Raman index | BPD density dislocations/cm$^2$ | TSD density dislocations/cm$^2$ | Sum of BPD density and TSD density |
|---|---|---|---|---|
| 71 | 0.22 | 10,440 | 370 | 10,810 |
| 72 | 0.18 | 8,650 | 380 | 9,030 |
| 73 | 0.15 | 7,390 | 370 | 7,760 |
| 74 | 0.11 | 5,990 | 370 | 6,360 |
| 75 | 0.07 | 4,820 | 360 | 5,180 |
| 76 | 0.04 | 4,110 | 360 | 4,470 |
| 77 | 0.02 | 3,690 | 350 | 4,040 |
| 78 | 0.01 | 3,560 | 340 | 3,900 |

Comparative Example 2

Comparative Example 2 is described next. In Comparative Example 2, a crystal was grown by using a set of pieces of commercially available graphite felt that had been treated by heat treatment at 2,000° C. The crucible structure is substantially the same as the one in Example 1. In Comparative Example 2, substantially the same preparation as in Example 1 was made for crystal growth, and the obtained SiC single crystal ingot was 103.1 mm in diameter and 16.5 mm in height. Similarly to Comparative Example 1, Comparative Example 2 uses common graphite felt and a common graphite crucible, and therefore is not reduced in fluctuations in heat input from the side surface of the single crystal ingot. SiC single crystal wafers manufactured from the obtained ingot may manage to partially accomplish one of low dislocation density and low elastic strain owing to a difference in growth condition, but cannot accomplish low dislocation density and low elastic strain both.

The obtained ingot was not tall enough to manufacture wafers that would have been No. 81 and No. 88. The ingot was therefore machined into six mirror-finished wafers having relative positions No. 82 to No. 87, and the wafers were evaluated for quality. Results of the evaluation are shown in Table 8. The wafers No. 84 to No. 87 in Table 8 have a basal plane dislocation density that is within the scope of the present invention. However, the Raman index is high in every wafer, meaning that none of the obtained wafers have characteristics that are within the scope of the present invention.

Homogeneous epitaxial growth was performed on a Si plane of the wafer No. 87 under the same conditions as those in Example 6 to grow an active layer having a thickness of approximately 5 μm. The count of epitaxial defects such as carrot defects in a surface of the resultant epitaxial film is considerably lower compared to the wafer No. 78 of Comparative Example 1, though higher than in the wafer No. 58 of Example 5. However, a high density of disorder in surface morphology such as bunching was observed. The cause thereof is probably disorder in the state of surface steps of the wafer due to elastic strain. A MOSFET structure was built on this epitaxial wafer, and the withstand voltage of its gate insulating film was measured to be approximately 340 V.

TABLE 8

| Wafer number | Raman index | BPD density dislocations/cm$^2$ | TSD density dislocations/cm$^2$ | Sum of BPD density and TSD density |
|---|---|---|---|---|
| 81 | — | — | — | — |
| 82 | 0.25 | 1,990 | 350 | 2,340 |
| 83 | 0.23 | 1,440 | 360 | 1,800 |
| 84 | 0.22 | 990 | 350 | 1,340 |
| 85 | 0.21 | 980 | 340 | 1,320 |
| 86 | 0.21 | 760 | 340 | 1,100 |
| 87 | 0.20 | 660 | 320 | 980 |
| 88 | — | — | — | — |

Comparative Example 3

Comparative Example 3 is described next. In Comparative Example 3, a set of pieces of commercially available graphite felt that had been treated by heat treatment at 2,000° C. was used to manufacture a wafer having a diameter of 150 mm. A crucible and heat insulating material used to grow an ingot for a 150 mm-diameter wafer have a structure similar to that of the crucible and heat insulating material used in Example 1, and are sized to the ingot for a 150 mm-diameter wafer. The crystal growth method in Comparative Example 3 is substantially the same as the method in Example 1. In Comparative Example 3, common graphite felt and a common graphite crucible are used, and fluctuations in heat input from the side surface of the single crystal ingot are therefore not reduced, which means that a SiC single crystal wafer that is low in dislocation density and elastic strain cannot be manufactured. The thus obtained SiC single crystal ingot was 158.5 mm in diameter and 33.2 mm in height.

The obtained ingot was machined into eight mirror-finished wafers having the same relative positions in the ingot as in Example 1 (the wafers were assigned wafer numbers 91 to 98 starting from the seed crystal side). The wafers were evaluated for quality. Results of the evaluation are shown in Table 9. The properties of the wafers are examined for each evaluation item. TSD in the wafers has a value that is within the scope of the present invention. However, BPD is high in every wafer and the Raman index is also high in most of the wafers. Consequently, none of the obtained wafers have characteristics that are within the scope of the present invention.

TABLE 9

| Wafer number | Raman index | BPD density dislocations/cm$^2$ | TSD density dislocations/cm$^2$ | Sum of BPD density and TSD density |
|---|---|---|---|---|
| 91 | 0.26 | 12,790 | 480 | 13,270 |
| 92 | 0.26 | 11,650 | 440 | 12,090 |
| 93 | 0.25 | 9,470 | 420 | 9,890 |
| 94 | 0.24 | 8,280 | 390 | 8,670 |
| 95 | 0.23 | 6,470 | 370 | 6,840 |
| 96 | 0.22 | 5,320 | 350 | 5,670 |
| 97 | 0.21 | 4,990 | 340 | 5,330 |
| 98 | 0.20 | 4,740 | 350 | 5,090 |

REFERENCE SIGNS LIST

1: seed crystal (SiC single crystal)
2: SiC single crystal ingot
3: sublimation raw material (SiC powder raw material)
4: graphite crucible
5: heat insulating material
6: graphite lid (crucible lid)
7: graphite support seat (crucible support seat and shaft)
8: double-walled quartz tube
9: work coil
10: pipe
11: mass flow controller
12: vacuum pump apparatus and pressure control apparatus
13a: radiation thermometer (for upper part of crucible)
13b: radiation thermometer (for lower part of crucible)
21: seed crystal (SiC single crystal)
22: SiC single crystal ingot
23: sublimation raw material (SiC powder raw material)
24: graphite crucible
25: heat insulating material
26: graphite lid (crucible lid)
27: thermal flux control member

The invention claimed is:

1. A silicon carbide single crystal wafer, which has a diameter of 100 mm or more, the silicon carbide single crystal wafer having, in a surface thereof, a basal plane dislocation (BPD) density of 500 dislocations per cm$^2$ or less, a threading screw dislocation (TSD) density of 200 dislocations per cm$^2$ or less, and a differential between a wavenumber of Raman scattered light measured at the center of the wafer and a wavenumber of Raman scattered light measured at a point located at 2 mm from a circumference of the wafer of 0.15 or less.

2. The silicon carbide single crystal wafer according to claim 1, wherein the differential between a wavenumber of Raman scattered light measured at the center of the wafer and the wavenumber of Raman scattered light measured at the point located at 2 mm from the circumference of the wafer is 0.1 or less.

3. The silicon carbide single crystal wafer according to claim 1, wherein the basal plane dislocation density in the surface is 300 dislocations per cm$^2$ or less.

4. The silicon carbide single crystal wafer according to claim 3, wherein a sum of the basal plane dislocation density and the threading screw dislocation density in the surface is 300 dislocations per cm$^2$ or less.

5. The silicon carbide single crystal wafer according to claim 1, wherein the basal plane dislocation density in the surface is 100 dislocations per cm$^2$ or less.

6. The silicon carbide single crystal wafer according to claim 1, wherein the threading screw dislocation density is 100 dislocations per cm$^2$ or less.

7. The silicon carbide single crystal wafer according to claim 1, wherein a sum of the basal plane dislocation density and the threading screw dislocation density in the surface is 500 dislocations per cm$^2$ or less.

8. A silicon carbide single crystal wafer, which has a diameter of 100 mm or more, the silicon carbide single crystal wafer having, in a surface thereof, a basal plane dislocation (BPD) density of 100 dislocations per cm$^2$ or less, a threading screw dislocation (TSD) density of 300 dislocations per cm$^2$ or less, and a differential between a wavenumber of Raman scattered light measured at the center of the wafer and a wavenumber of Raman scattered light measured at a point located at 2 mm from a circumference of the wafer of 0.15 or less.

9. A silicon carbide single crystal wafer, which has a diameter of 100 mm or more, the silicon carbide single crystal wafer having, in a surface thereof, a basal plane dislocation (BPD) density of 300 dislocations per cm$^2$ or less, a threading screw dislocation (TSD) density of 300 dislocations per $cm^2$ or less, and a differential between a wavenumber of Raman scattered light measured at the center of the wafer and a wavenumber of Raman scattered light measured at a point located at 2 mm from a circumference of the wafer of 0.15 or less, wherein a sum of the basal plane dislocation density and the threading screw dislocation density in the surface is 300 dislocations per $cm^2$ or less.

10. The silicon carbide single crystal wafer according to claim 8 or 9, wherein the threading screw dislocation density is 200 dislocations per $cm^2$ or less.

* * * * *